United States Patent [19]

Best

[11] Patent Number: 5,284,189
[45] Date of Patent: Feb. 8, 1994

[54] CONDUCTIVE INK PACKAGING FOR PRINTED CIRCUIT BOARD SCREEN PRINTING OPERATIONS

[75] Inventor: David R. Best, Los Alamos, N. Mex.

[73] Assignee: Printron, Inc., Albuquerque, N. Mex.

[21] Appl. No.: 853,399

[22] Filed: Mar. 18, 1992

Related U.S. Application Data

[63] Continuation-in-part of Ser. No. 852,049, Mar. 16, 1992.

[51] Int. Cl.⁵ .................................. B65D 17/00
[52] U.S. Cl. .................................. 141/114; 141/65; 383/211; 383/117; 206/0.5; 222/95; 222/106
[58] Field of Search ................ 141/8, 10, 65, 67, 114, 141/313–317; 383/63, 117, 210, 211; 206/0.5, 1.9; 101/114, 125, 126, 127, 127.1, 129, 494; 222/92, 95, 105–107

[56] References Cited

U.S. PATENT DOCUMENTS

| | | | |
|---|---|---|---|
| 2,878,967 | 3/1959 | Duke | 222/107 |
| 3,011,682 | 12/1961 | Kus | 222/107 X |
| 3,209,676 | 10/1965 | Zimmermann et al. | 206/0.5 |
| 3,567,074 | 3/1971 | Brown | 222/107 |
| 3,886,863 | 6/1975 | Carabott et al. | 101/125 |
| 4,141,292 | 2/1979 | Hirata | 101/125 |
| 4,557,620 | 12/1985 | Hancy | 101/125 X |
| 4,938,262 | 7/1990 | Williams et al. | 141/114 |
| 5,165,337 | 11/1992 | Schlundt | 101/114 |

FOREIGN PATENT DOCUMENTS

| | | | |
|---|---|---|---|
| 3140018 | 4/1983 | Fed. Rep. of Germany | 383/210 |
| 1503913 | 3/1978 | United Kingdom | 206/0.5 |

*Primary Examiner*—J. Casimer Jacyna
*Attorney, Agent, or Firm*—Lowe, Price, LeBlanc & Becker

[57] ABSTRACT

A package contains conductive inks or slurries adapted for attachment to a screen printer for applying the inks to a substrate for firing into printed circuit boards. The bag interior containing the ink is formed between a liquid and gaseous impermeable top wall connected along its periphery to a bottom wall formed with openings through which the ink is adapted to migrate towards the print screen under vacuum. A seal member extends around the entire periphery of the bag and is adapted to sealingly mate with a corresponding fastening element attached to the print frame to form an air seal between the bag and print frame in operative position. A removable, peel-away cover normally covers the screen bottom wall to allow the bag to have a long shelf life.

14 Claims, 4 Drawing Sheets

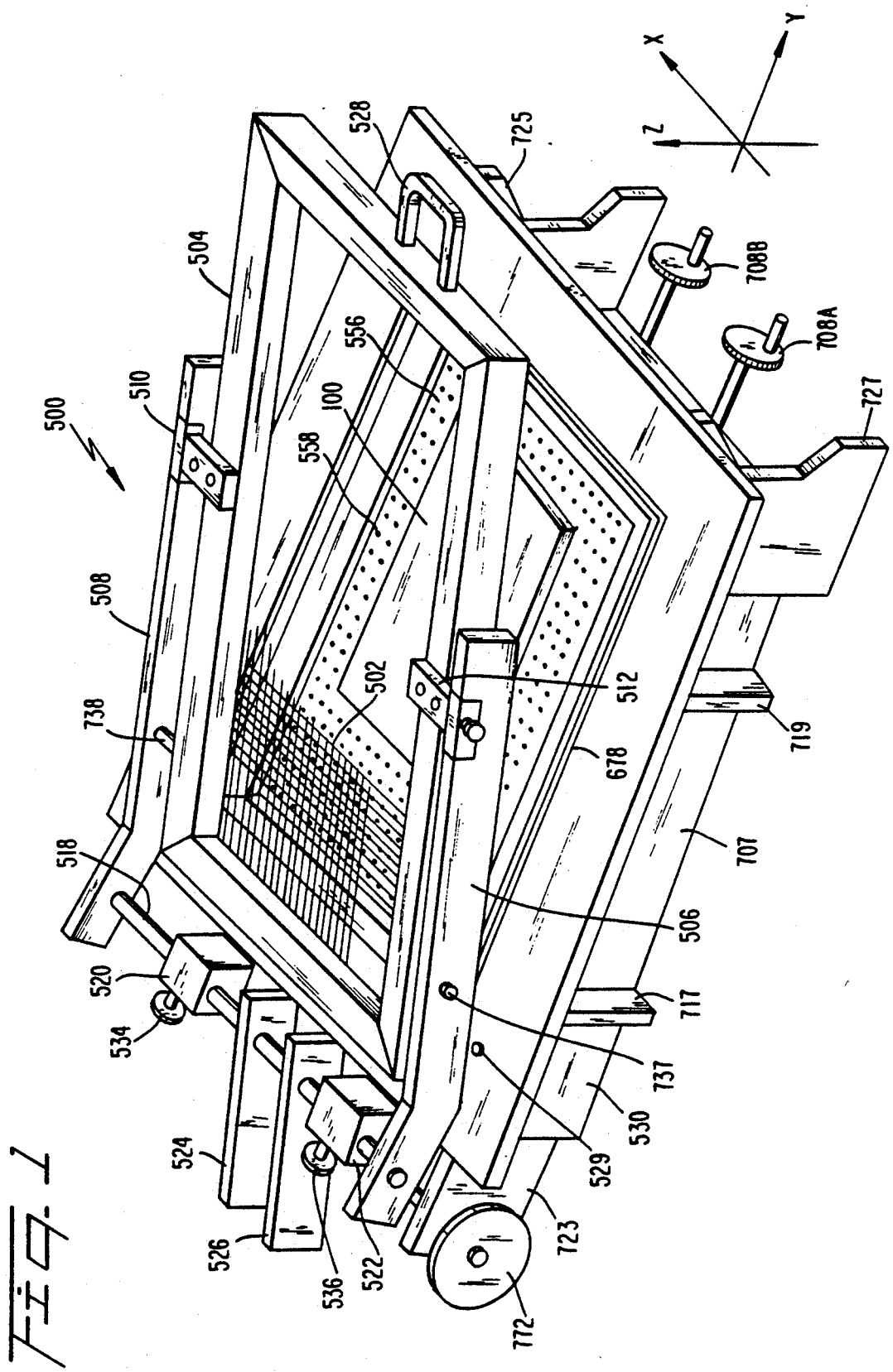

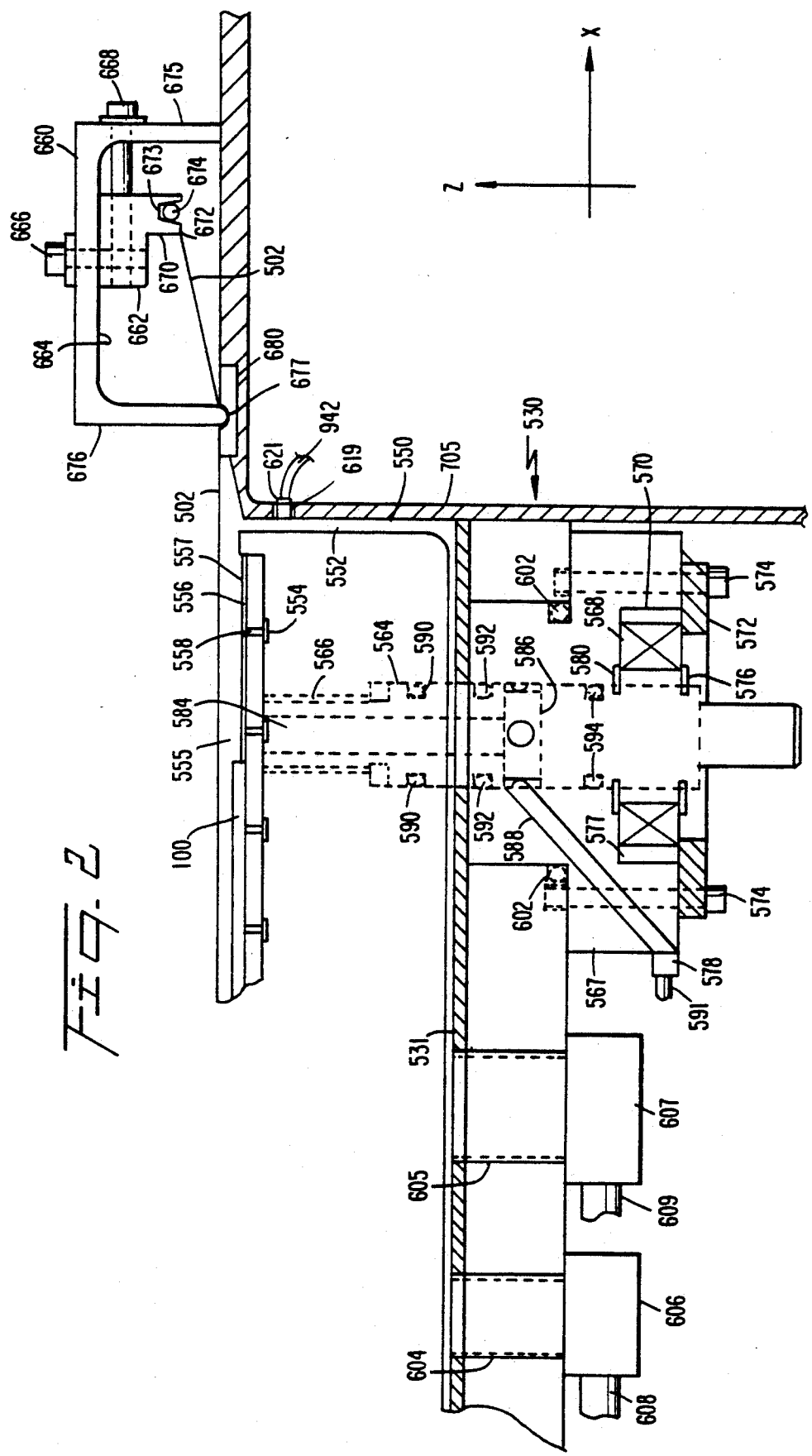

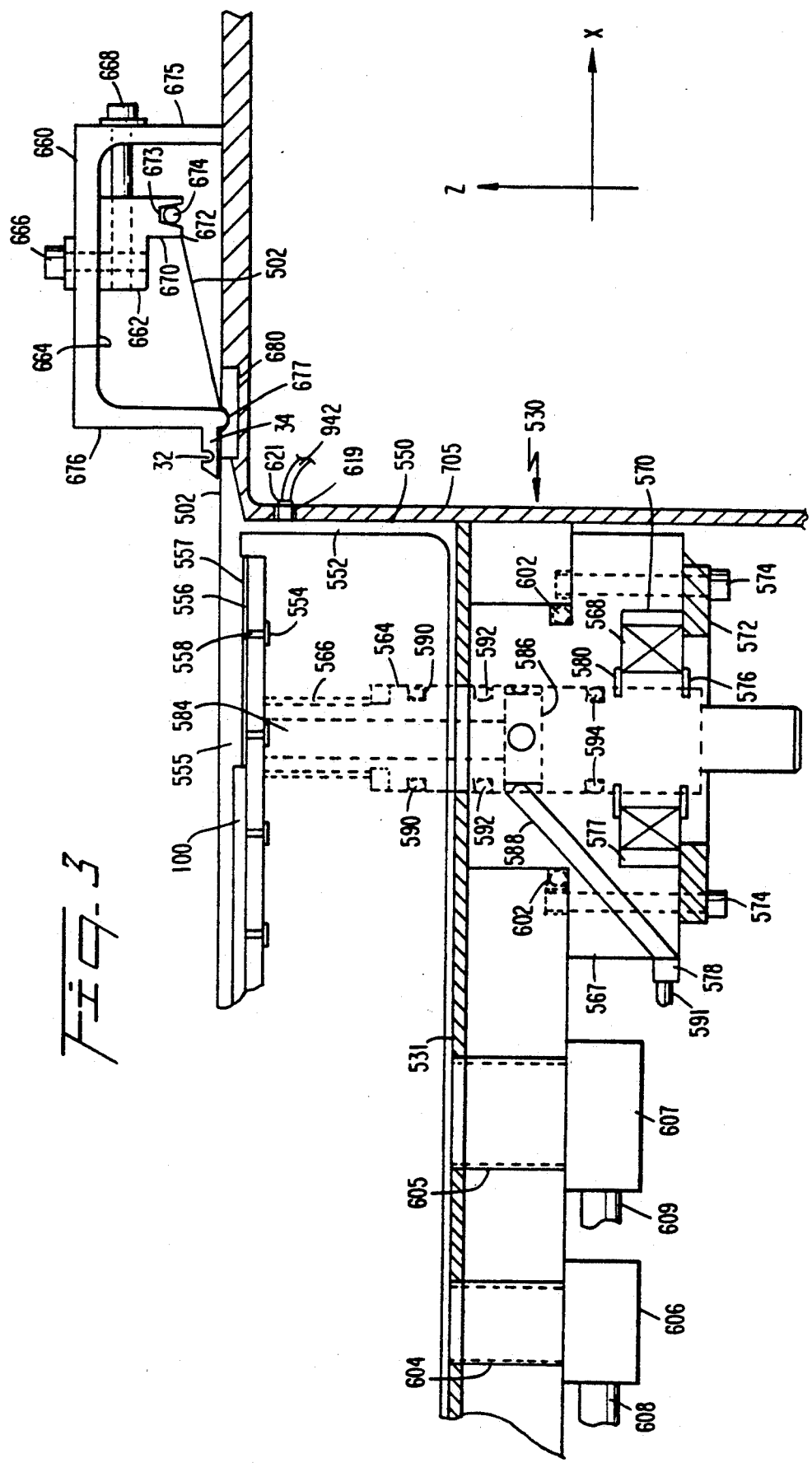

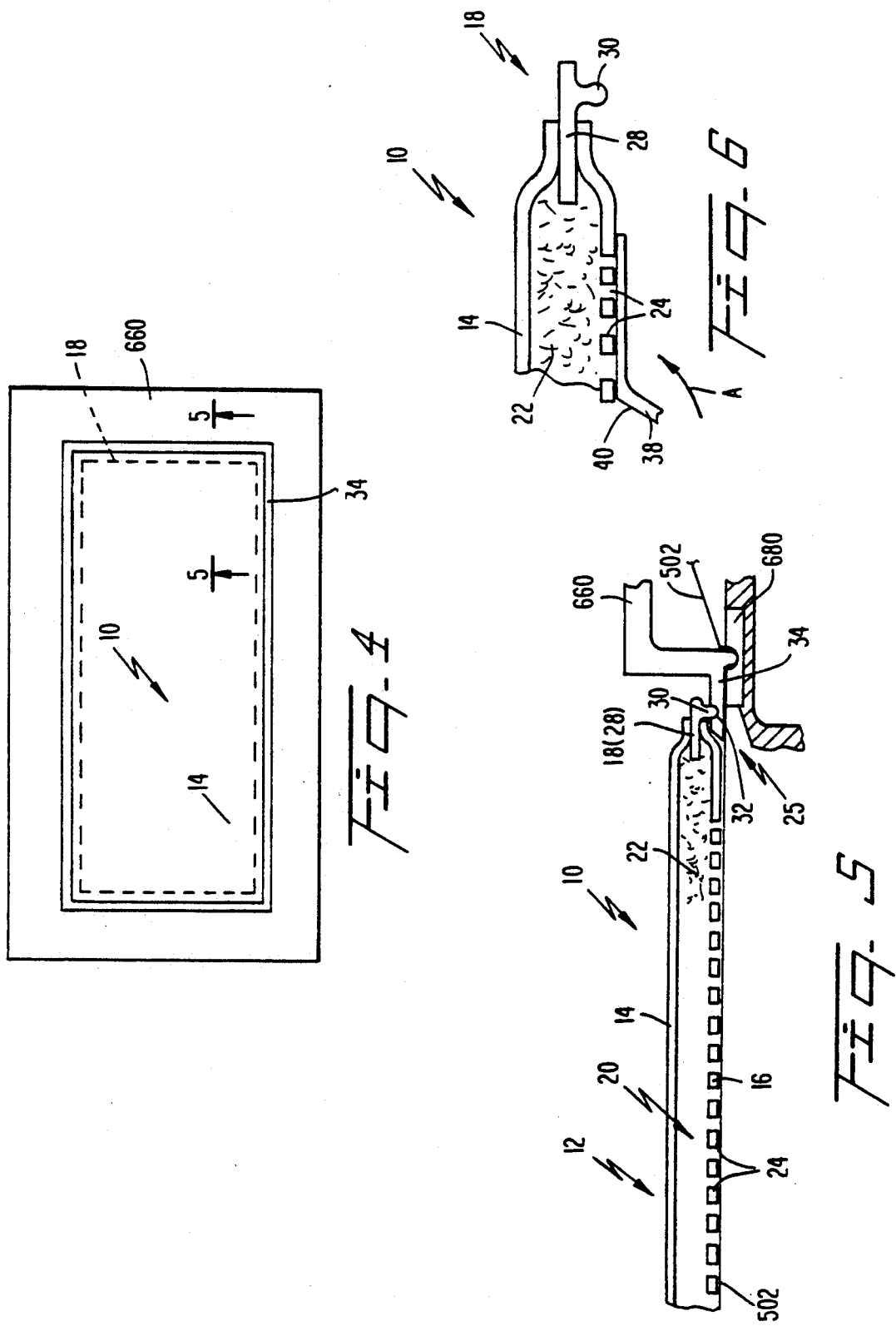

CONDUCTIVE INK PACKAGING FOR PRINTED CIRCUIT BOARD SCREEN PRINTING OPERATIONS

RELATED APPLICATIONS

This application is a continuation-in-part of pending application Ser. No. 07/852,049, filed Mar. 16, 1992 for "Apparatus and Process for Screen Printing", assigned to Printron, Inc. Albuquerque, N. Mex.

TECHNICAL FIELD

The present invention relates generally to vacuum screen printing of conductive powders and inks onto circuit board substrates and, more particularly, to packages connectable to the screen printing equipment and containing the inks for supply to the screens.

BACKGROUND ART

FIG. 1 is an illustration of a screen printer disclosed in my above-identified co-pending application. The printer uses a vacuum pull-down method for deflecting a printing screen 502 which is coated with viscous ink, into contact with a substrate 100. In the preferred embodiment the substrate is a printed circuit board substrate and the ink comprises conductive metal particles suspended in a viscous carrier or screening agent. It should be understood, however, that other types of substrates and inks may be used with this printer (all such materials are collectively referred to hereafter as "ink").

Printing screen 502, in which a desired printing pattern has been formed by conventional means, is supported in a screen holder 504. Holder 504 is mounted at either side to frame mount arms 506 and 508 by support members 510 and 512 and bolts 737 and 738. Frame mount arms 506 and 508 are fixably mounted at one end to pivot bar 518. Pivot bar 518 extends through a pair of positioning devices 520 and 522, described hereinafter, which are used to adjust the position of pivot bar 518 along the Y-axis and around the Z-axis (commonly referred to as the "theta axis"). Positioning devices 520 and 522 are manually controlled, respectively, by knobs 534 and 536. Adjusting knob 772 is used to adjust the position of screen holder 504 along the X-axis. Thus, by turning knobs 534, 536 and 772, the operator can adjust the position of screen holder 504 until screen 502 is precisely registered above substrate 100.

A pair of counterweights 524 and 526 are rigidly attached to pivot bar 518, allowing the operator to easily rotate screen holder 504 about pivot bar 518. Alternatively, air springs may be used for this purpose. The operator does so by grasping handle 528 and either lifting it until the screen holder is in the fully opened position or pushing it downward until the bottom edges of the screen holder contact vacuum seal 678 inserted into the upper surface of support frame 530. Support frame 530 has a central recess therein, in which substrate 100 is positioned on top of printing platen 556. Platen 556 is bonded to a product carrier 550 (illustrated in FIG. 2). Product carrier 550 and, hence, platen 556 may be adjusted along the Z axis by rotating knobs 708A and 708B, to thereby space substrate 100 from screen 502 to the desired degree. Platen 556 has regularly spaced apertures 558 therein used for substrate hold-down, as described below. Non-porous tape 557 (FIG. 2) is used to cover the apertures in platen 556 not covered by the substrate.

When screen holder 504 is rotated to the fully down position, the rear section thereof depresses a microswitch 529, which causes a vacuum to draw substrate 100 into firm contact with platen 556, thereby preventing relative movement between them during the printing operation. In the down position the surface of screen 502 is essentially parallel to the surface of substrate 100. After ink has been applied to the upper surface of screen 502, filling all of the unmasked screen openings, a vacuum print system is energized. This system evacuates the region between substrate 100 and screen 502, causing screen 502 to deflect downward into contact with substrate 100 and ink to be transferred through the screen openings onto the substrate.

After ink transfer, the vacuum is released and the operator rotates screen holder 504 away from substrate 100, removes the substrate from the printer and inserts the next substrate for printing. Concurrent with release of the print vacuum, a pilot actuated valve is operated to vent the print chamber to atmospheric pressure, thereby avoiding a double strike of ink onto the substrate. Upon rotating screen holder 504 away from substrate 100, micro-switch 529 is opened, shutting off the hold-down vacuum and returning the pneumatic hold-down system 900 to the standby mode. Screen 502 may be removed from holder 504 whenever the operator desires to do so, such as at the end of a production run.

FIG. 2 depicts a sectional view of screen holder 504, support frame 530 and the hold-down mechanism for a substrate 100. A product carrier 550 is positioned in a recess of the support frame. The recess periphery is defined by the vertical portions of side members 705 and 707, a front member and a rear member (not shown in detail), while the recess bottom is defined by support member 531. The lateral dimensions of product carrier 550 are slightly less than the corresponding dimensions of the recess, thereby defining an evacuation channel 552 between product carrier 550 and recess.

Screen holder 504 employs an extruded channel 660 having a U-shaped cross-section. In the preferred embodiment, channel 660 is made of aluminum. Four sections of such channel stock are welded together into a rectangular frame, as shown in FIG. 1. In FIG. 1, screen holder 504 is in a partially open position, while in FIG. 2 it is in the fully down position.

A tensioning bar 662, shown in cross-section in FIG. 2, runs the length of channel 660 and is secured to the top portion 664 of U-shaped channel 660 by a plurality of securing bolts 666. Securing bolts 666 are fed through a plurality of bores spaced symmetrically about channel 660. A plurality of tension adjusting bolts 668 are secured to tensioning bar 662 through outside leg 675 of U-shaped channel 660. Again, bolts 668 are spaced symmetrically along the length of channel 660. Tensioning bar 662 has an offset portion 670 which has two legs 672 forming a U-shaped recess 673 that accepts a tensioning rod 674 therein. The inner sides of legs 672 are tapered inwardly so that the entrance to recess 673 is slightly wider than the diameter of rod 674 combined with a single wrap of screen 502, while the bottom of recess 673 is slightly narrower than the rod 674/screen 502 combination, so that when rod 674 is inserted therein it is held snugly. In the preferred embodiment tensioning rod 674 is made of stainless steel and may be inserted along the entire length of channel 660.

Printing screen 502 passes over the inside leg 676 of channel 660, over leg 672 and is secured in recess 673 by tensioning rod 674. Inside leg 676 has a rounded bottom 677 and is slightly longer than outside leg 675. Screen 502 is stretched taut by adjusting bolts 666 around the periphery of channel 660. Inside leg 676 is rounded to reduce the likelihood of tearing screen 502 where the two come in contact. Support frame 530 has a channel 680 spaced around the periphery of the recess, as shown more clearly in FIG. 7a of my aforesaid copending application.

Referring again to FIG. 2, the seal 678 (in Figure) is inserted into channel 680, so that when U-shaped channel 660 is in the fully down position, rounded bottom 677 of inner leg 676 rests on the seal. In the preferred embodiment seal 680 is made of very low durometer rubber (e.g., 50–60 DUR). Since rounded bottom 677 is pulled downward into the seal by vacuum pressure during the printing operation, slightly shorter outside leg 675 rests against the top surface of support frame 530 when screen holder 504 is in the fully-down position.

As indicated above, screen 502 has been treated in conventional manner before insertion into holder 504 so that the openings therein define the desired pattern to be printed on substrate 100. When ink of sufficient viscosity is applied to the upper surface of screen 502, these openings remain covered prior to printing. In the preferred embodiment, the ink has a minimum viscosity of approximately 200,000 centipoise. Thus, when screen 502 is tautly mounted in screen holder 504, as described above, and holder 504 is in the fully-down position, two parallel air-tight paths are defined, one for screen hold-down and the other for substrate hold-down during the printing operation.

Referring again to FIG. 2, the screen hold-down path begins with the region 555 between screen 502 and platen 556, and continues along evacuation channel 552 to evacuation port 604, through fitting 606, hose 608, and a fitting (at 613 in my aforesaid copending '049 application at FIG. 8) to vacuum hold-down system (at 900, shown in FIG. 12 of my aforesaid copending '049 application). When a vacuum is drawn along this path, screen 502 is deflected downward into contact with substrate 100, and ink on the upper surface of screen 502 is drawn through the openings therein into contact with substrate 100. When the vacuum is released, screen 502 returns to its normal unstretched position, but a quantity of ink is transferred to the surface of substrate 100 through a combination of vacuum and meniscus forces, thereby defining the desired pattern on substrate 100.

The substrate hold-down path begins with apertures 558 in platen 556, and runs through channels 554 and manifold grooves in product carrier 550, hollow shafts 584 and 586 in vertical adjusting bolt 564, bore 588 in vertical adjustment mount bracket 567, fitting 578 and hose 591 to vacuum system 900. The vacuum drawn through this path holds substrate 100 firmly in contact with platen 556 during the printing operation so that it does not move in response to meniscus forces when screen 502 returns to its unstretched rest position.

It is important to maintain the viscosity of the conductive ink at predetermined levels to ensure adequate flow through the screen 502 during printing. If, however, suitable conductive inks or slurries are improperly stored prior to use, solvents or binders within the inks may be subjected to evaporation which dries the ink and changes the viscosity to possibly unacceptable levels. Additionally, if the inks are stored in an oxygen containing environment, oxidation of the conductive metals in the ink is likely to occur which may disadvantageously prevent complete fusing of the ink to the substrate at controlled temperature.

It is accordingly one object of the present invention to provide packaging for conductive slurries or inks which allow for long shelf life of the inks prior to use.

Another object is to maintain the viscosity of the ink at predetermined levels to ensure adequate flow through a screen during printing by preventing evaporation of volatiles and other components in the ink.

Still another object is to store the ink out of contact with oxygen to prevent oxidation of conductive metals in the ink.

A further object is to store ink in packaging which is easily attachable to a screen print frame for easy and immediate use.

SUMMARY OF THE INVENTION

A package for containing an ink or slurry having metal particles to be deposited onto a substrate for subsequent firing into electrical conductors, comprises a bag for containing the ink or slurry in a bag interior formed between first and second side walls. The first side wall is preferably formed of a material isolating the ink or slurry from the external environment and the second side wall is formed with openings of predetermined size to allow for flow of the ink or slurry from the bag through the openings. A cover is attached to the bag for normally covering the second side wall openings to prevent flow of ink from the bag interior and to isolate the ink, with the first side wall, from the external environment. Removal of the cover from the second side wall exposes the ink to an operating environment for flow through the openings.

Attaching means, disposed around the periphery of the bag, is preferably provided for attaching the bag to the periphery of a print frame of a screen printer. The attaching means, in the preferred embodiment, sealingly attaches the bag to the print frame with the first side wall facing upward and the second side wall facing downwards toward the print screen. The resulting seal and upward orientation of the first side wall serves to isolate the second side wall and ink from the external environment.

In accordance with the invention, the attaching means includes one of a male or female member extending around the entire periphery of the first side wall and the other of the male or female member is attached to project inwardly from the print frame. Upon mating engagement of the male and female members, the bag is sealingly secured to the print frame around its periphery.

The male and female attachment members may be of different forms as will occur to one of ordinary skill in the art from a review of this application. However, a preferred form is "zip-lock" male and female attachment members that are easily releasably attachable to each other to provide a reliable seal.

The cover is preferably made of a gas and liquid impermeable material. Adhesive is disposed on one face of the cover for adhesive contact with substantially the entire surface area of the second side wall. Advantageously, the cover is peelable from the second side wall without leaving adhesive residue on the second wall which may otherwise obscure the openings and disrupt the flow of ink down to the screen.

The second side wall is preferably a screen material and the openings therein are of at least one predetermined mesh size.

The first side wall is preferably formed of flexible material to allow the bag to collapse as the ink is supplied to the print screen and the volume in the bag reduces.

The ink or slurry is normally contained in the bag under a vacuum or in a gaseous environment preventing oxidation of the metal particles.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF DRAWINGS

FIG. 1 is a perspective view of a screen printer which may be adapted for use with the ink packaging system according to the present invention;

FIG. 2 is a detailed partial sectional view of the print frame and print screen in the printer of FIG. 1;

FIG. 3 is a view similar to FIG. 2 of the print frame modified to incorporate attaching means for securing the ink package to the print frame in accordance with the present invention;

FIG. 4 is a top elevational view partly in section, of an ink package of the invention operatively attached to the print frame;

FIG. 5 is a sectional view taken along the line 5—5 of FIG. 4 to depict a cross-section of the ink package in accordance with the present invention; and FIG. 6 is a partial cross-sectional view depicting a peel-away cover for the ink package.

BEST MODE FOR CARRYING OUT THE INVENTION

Ink package 10, with reference to FIGS. 4-6, comprises a bag 12 having a gas and liquid impermeable flexible top wall 14 and a bottom wall 16 sealed along their entire edges to each other (not shown) or to an attachment member 18 as depicted in FIG. 5 to define a bag interior 20 adapted to contain an ink or slurry 22. This ink or slurry 22 preferably contains metallic particles of one or more particle size (e.g., 70 microns or less) which may be suspended in solvents or binders to form an ink or paste.

The bag 12 formed between the top and bottom walls 14, 16 may extend over the entire area formed between the print frame 660 to overlie the screen 502 as best depicted in FIG. 4. The openings or meshes 24 in the bottom wall 16 are preferably coextensive with the working area of the screen 502 so that an appropriate amount of ink is supplied through the bottom wall openings 24 to the screen 502 under vacuum.

To sealingly secure the ink package 10 to the entire periphery of print frame 660 and maintain vacuum conditions in the region of print screen 502, a sealing connection 25 is provided between the package and print frame. In the preferred embodiment depicted in FIG. 5, the seal 25 may take the form of a male closure strip 28 extending along the entire edges of each top and bottom wall 14, 16. The closure strip 28 may typically be formed from thermoplastic material which can be heat fused or otherwise sealingly secured to the top and bottom wall edges 14, 16. The closure strip 28 may include a downwardly depending male interlocking element 30 (which may be coextruded with the strip) adapted to sealingly engage and mate with an upwardly directed interlocking channel 32 formed in a female closure strip 34 attached to and projecting inwardly from the print frame 660. By depressing the entirety of the bag edges after removing the peelable cover 38 and positioning the bag on top of screen 502 with the screen bottom wall 16 facing downwardly, a complete air seal (which may also be a liquid seal) is obtained between the bag periphery with the print frame 660.

Representative interlocking closure strips are disclosed, for example, in U.S. Pat. Nos. 4,363,345; 5,012,561; 4,829,641; 4,285,105; 4,578,813; 3,338,285; and 4,964,739. From a review of this specification, one of ordinary skill in the art will easily understand the manner in which the closure strips 28, 34 may be secured to both the bag 10 and print frame 660 to carry out the objects of the present invention.

The top wall 14 of the bag 10, as mentioned above, is preferably made of flexible, liquid and gas impermeable material which isolates the ink or slurry 22 in the bag interior 20 from the external environment to prevent oxidation and drying out of the ink. The top wall 14 may be formed of a thermoplastic material.

The bottom wall 16 may be formed of any suitable material which is capable of being formed with suitably sized mesh openings 24 allowing the ink or slurry 22 to migrate across the bottom wall through the openings to load the screen 502 with ink upon demand (e.g., vacuum being applied to the screen in the aforesaid manner. In one embodiment, the thin wettable screen 16 may be a wire mesh sealingly secured to the periphery of the top wall 14 and having approximately 30 lines per inch.

When not in use, the bottom wall screen 16 is isolated from the external environment with cover 38 which is coextensive with at least the entire area of the screen openings 24. With reference to FIG. 6, this cover 38 is preferably coated with an adhesive 40 so as to effect adhesive contact with the entire surface area of the bottom surface of the bottom wall screen. Upon peeling of the cover 38 in the direction of arrow A in FIG. 6, the cover is entirely removed from the bottom wall screen 16 so that the bag may then be sealed in place to the print frame 660 in the manner described above. A suitable adhesive 40 will occur to one of ordinary skill in the art as a result of the above disclosure. This adhesive preferably has the characteristic of allowing the cover 38 to be peeled from the screen bottom wall 16 without leaving any adhesive residue on the bottom wall which may otherwise clog the openings 24 and affect the flow of ink to the print screen 502.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

I claim:

1. A package for containing an ink or slurry to be deposited onto a substrate for subsequent firing into electrical conductors, comprising:

(a) a bag for containing said ink or slurry, said bag having a first side wall formed of a material isolating the ink or slurry from the external environment, and a second side wall connected to the first side wall to form a bag interior therewith containing the ink, said second side wall being formed with openings of predetermined size to allow for flow of the ink or slurry therethrough; and (b) a cover attached to the bag for normally covering the second side wall to prevent flow of ink from the bag interior through the openings and to isolate the ink in cooperation with the first side wall from the external environment, whereby removal of the cover from the bag exposes the ink to an operating environment for flow through the second side wall openings for use; and (c) further comprising a mating attachment arrangement disposed around the periphery of the bag, for attaching the bag to a complementary mating periphery of a spring frame of a screen printer.

2. The package of claim 1, wherein said mating attachment arrangement sealingly attaches the bag to the print frame with the first side wall facing upward and the second side wall facing downward towards a print screen, the resulting seal and upward orientation of the first side wall serving to isolate the second side wall and ink from the external environment.

3. The package of claim 2, wherein said attachment arrangement includes one of a male or female member extending around the entire periphery of the first side wall and the other of the male or female members attached to project inwardly from the print frame to sealingly secure the bag to the print frame.

4. The package of claim 2, wherein said attachment arrangement seal is an air seal.

5. The package of claim 1, wherein said cover is made of a gas and liquid impermeable material.

6. The package of claim 1, further comprising an adhesive disposed on a face of the cover for adhesive contact with substantially the entire area of the second side wall.

7. The package of claim 6, wherein said cover is peelable from the second side wall without leaving adhesive residue on the second side wall.

8. The package of claim 6, wherein adhesive contact is at least with the entire area of the second side wall in the region of the openings so the ink is prevented from passing through the openings and being disposed between the cover and the second side wall.

9. The package of claim 1, wherein said second side wall is a screen and the openings therein are of at least one predetermined mesh.

10. The package of claim 9, wherein the first side wall is flexible to allow the bag to collapse as the ink is supplied to the print screen and the ink volume in the bag reduces.

11. The package of claim 9, wherein the second side wall screen is a wire mesh.

12. The package of claim 11, wherein the predetermined mesh size is about 30 lines per inch.

13. The package of claim 1, wherein the periphery of the second side wall is formed without openings and sealingly joined to the periphery of the first side wall.

14. The package of claim 13, wherein approximately at least 85% of the second side wall is formed with said openings.

* * * * *